United States Patent
Kang et al.

(10) Patent No.: US 7,360,144 B2
(45) Date of Patent: Apr. 15, 2008

(54) MULTI-BIT NONVOLATILE FERROELECTRIC MEMORY DEVICE HAVING FAIL CELL REPAIR CIRCUIT AND REPAIR METHOD THEREOF

(75) Inventors: Hee Bok Kang, Daejeongwangyeok-si (KR); Jin Hong Ahn, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 293 days.

(21) Appl. No.: 11/320,959

(22) Filed: Dec. 30, 2005

(65) Prior Publication Data

US 2006/0242538 A1    Oct. 26, 2006

(30) Foreign Application Priority Data

Apr. 21, 2005    (KR) ............... 10-2005-0033156

(51) Int. Cl.
    *G11C 29/00*    (2006.01)
(52) U.S. Cl. ............................. 714/764; 365/200
(58) Field of Classification Search ............ 365/145, 365/200; 714/718, 763, 764
    See application file for complete search history.

(56) References Cited

U.S. PATENT DOCUMENTS

| 4,873,664 | A | * | 10/1989 | Eaton, Jr. ............ 365/145 |
| 5,532,953 | A | * | 7/1996 | Ruesch et al. ........ 365/145 |
| 5,680,344 | A | * | 10/1997 | Seyyedy ............. 365/145 |
| 6,333,876 | B1 |  | 12/2001 | Kawasaki et al. |
| 6,510,072 | B2 |  | 1/2003 | Kang ............... 365/145 |
| 6,597,608 | B2 | * | 7/2003 | Kang et al. ......... 365/200 |
| 6,788,596 | B2 |  | 9/2004 | Kim et al. |
| 6,842,387 | B2 | * | 1/2005 | Kang ............... 365/200 |
| 7,142,471 | B2 | * | 11/2006 | Fasoli et al. ........ 365/200 |
| 2002/0044489 | A1 |  | 4/2002 | Kim |
| 2002/0199130 | A1 |  | 12/2002 | Kuo |

FOREIGN PATENT DOCUMENTS

| JP | 6-309896 A | 11/1994 |
| JP | 10-289595 | 10/1998 |
| JP | 2000-231798 | 8/2000 |
| JP | 2001-035189 | 2/2001 |
| JP | 2002-184200 | 6/2002 |
| KR | 100492793 B1 | 5/2005 |

* cited by examiner

*Primary Examiner*—David Ton
(74) *Attorney, Agent, or Firm*—Townsend and Townsend and Crew LLP

(57) ABSTRACT

A multi-bit nonvolatile ferroelectric memory device comprises a plurality of memory cell arrays each including a plurality of multi-bit unit cells connected serially, and a correcting block adapted and configured to group the predetermined number of multi-bit unit cells in one memory group to store a data level signal corresponding to the same multi-bit data in each memory group at a write mode, and to convert data level signals of the selected memory group at a read mode into the multi-bit data and compare the multi-bit data in each bit to identify the same data bit as an effective data bit. As a result, the multi-bit nonvolatile ferroelectric memory device includes a fail cell repair circuit to effectively process randomly distributed cell data.

15 Claims, 7 Drawing Sheets

MULTI-BIT NONVOLATILE FERROELECTRIC MEMORY DEVICE HAVING FAIL CELL REPAIR CIRCUIT AND REPAIR METHOD THEREOF

BACKGROUND OF THE INVENTION

1. Field of the Invention

The present invention relates to a nonvolatile ferroelectric memory device including a failed cell repairing circuit and a repair method thereof, and more specifically, to a technology of effectively processing randomly distributed cell data as well as failed cell repairing circuits of a multi-bit nonvolatile ferroelectric memory device.

2. Description of the Related Art

Generally, a ferroelectric random access memory (hereinafter, referred to as 'FeRAM') has attracted considerable attention as the next generation memory device because it has a data processing speed as fast as a Dynamic Random Access Memory (hereinafter, referred to as 'DRAM') and preserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

Meanwhile, a conventional multi-bit nonvolatile ferroelectric memory device has a wide data distribution in its initial process. In this case, the cell data are distributed between "00" and "01", "01" and "10", and "10" and "11". When the cell data are randomly distributed, it is difficult to repair a failed cell with a general repair circuit and to effectively utilize cell data.

SUMMARY OF THE INVENTION

Various embodiments of the present invention are directed at storing the same multi-bit data in a plurality of unit cells included in one group and comparing the multi-bit data of unit cells in each group to effectively process randomly distributed data in a multi-bit nonvolatile ferroelectric memory device.

According to one embodiment of the present invention, a multi-bit nonvolatile ferroelectric memory device comprises a plurality of memory cell arrays each including a plurality of multi-bit unit cells connected serially, and a correcting block adapted and configured to group the predetermined number of multi-bit unit cells in one memory group to store a data level signal corresponding to the same multi-bit data in each memory group at a write mode, and to convert the data level signal of the selected memory group at a read mode into the multi-bit data and compare the multi-bit data in each bit to identify the same data bit as an effective data bit.

According to one embodiment of the present invention, a method for repairing a failed cell of a multi-bit nonvolatile ferroelectric memory device comprises the write step of storing a data level signal corresponding to the same multi-bit data inputted to a memory group including the predetermined number of multi-bit unit cells, and the read step of converting data level signals stored in the memory group into multi-bit data and comparing the multi-bit data in each bit to identify the same data bit as an effective data bit.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
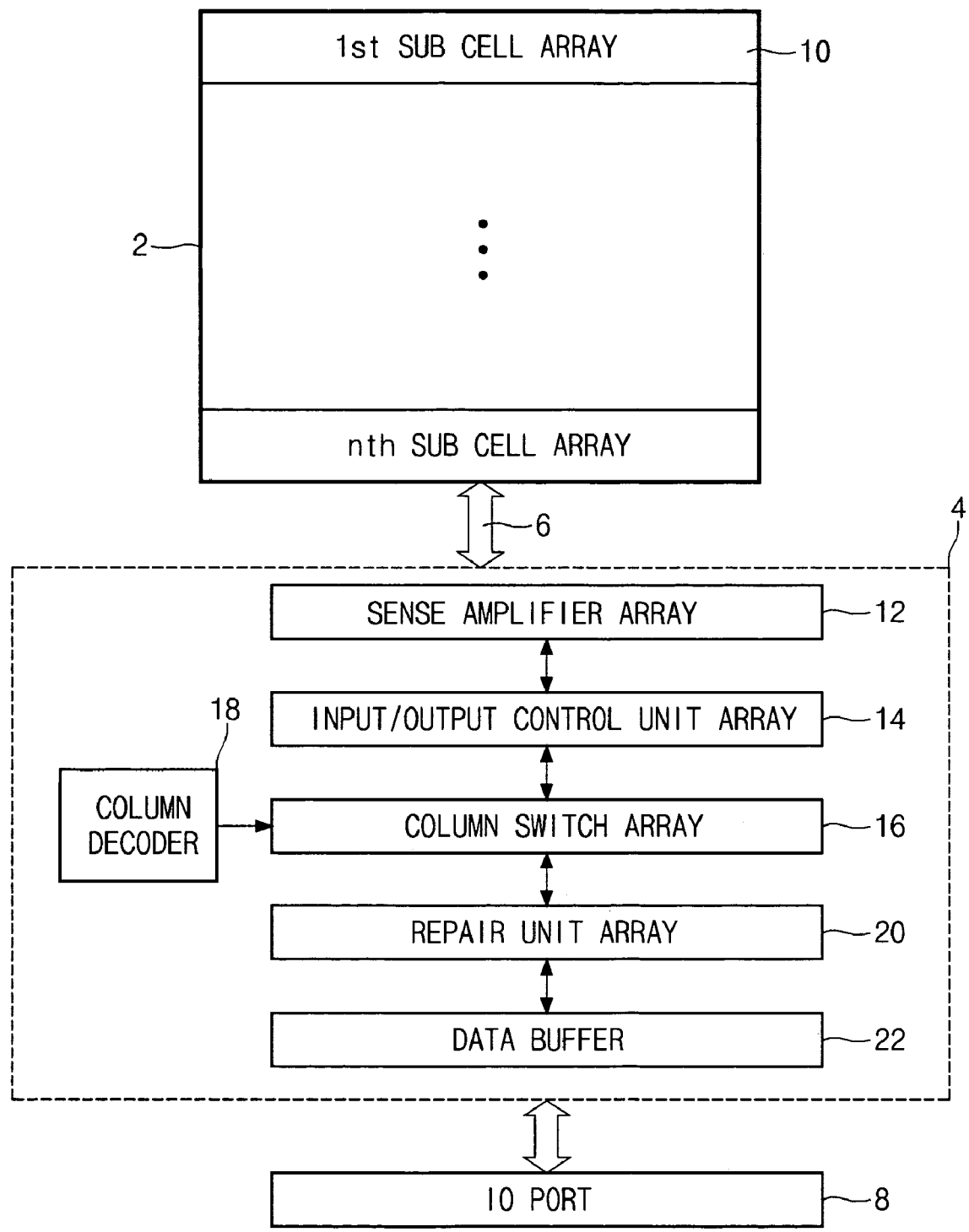
FIG. 1 is a block diagram illustrating a multi-bit nonvolatile ferroelectric memory device according to an embodiment of the present invention.

FIG. 1 is a block diagram illustrating a multi-bit nonvolatile ferroelectric memory device according to an embodiment of the present invention.

In this embodiment, a multi-bit nonvolatile ferroelectric memory device comprises a cell array block 2, a failed cell repair block 4, a data bus 6, and an input/output port 8.

The cell array block 2 comprises a plurality of sub cell arrays 10. Each of the sub cell arrays 10 has a hierarchical bit line structure including a plurality of sub bit lines SBL connected to one main bit line MBL.

The failed cell repair block 4 comprises a sense amplifier array 12, an input/output control unit array 14, a column switch array 16, a column decoder 18, a repair unit array 20 and a data buffer 22.

The sense amplifier array 12 includes a plurality of sense amplifiers each configured to detect a level of data on the main bit line MBL at a read mode to output the data level to the input/output control unit 14.

The input/output control unit array 14 comprises a plurality of input/output control units each configured to encode a detection signal outputted from the sense amplifier array 12 and convert the detection signal into 2 bit data to transmit the data to the column switch array 16 at the read mode, and to convert the 2 bit data into a data level signal and transmit the signal to the sense amplifier array 12.

The column switch array 16 comprises a plurality of column switches each configured to selectively transmit 2 bit data between the input/output control unit array 14 and the repair unit array 20 in response to a column selecting signal YI of the column decoder 18.

The repair unit array 20 comprises a plurality of repair units each configured to compare multi-bit data received from the column switch array 16 in each bit to detect a failed cell, and to repair failed data of the detected failed cell into an effective data bit.

The data buffer 22 buffers effective data received from the repair unit array 20 and then externally inputted multi-bit data.

The IO port 8 outputs a signal applied from the data buffer 22 externally or outputs an externally applied signal to the data buffer 22.

Figure 2:
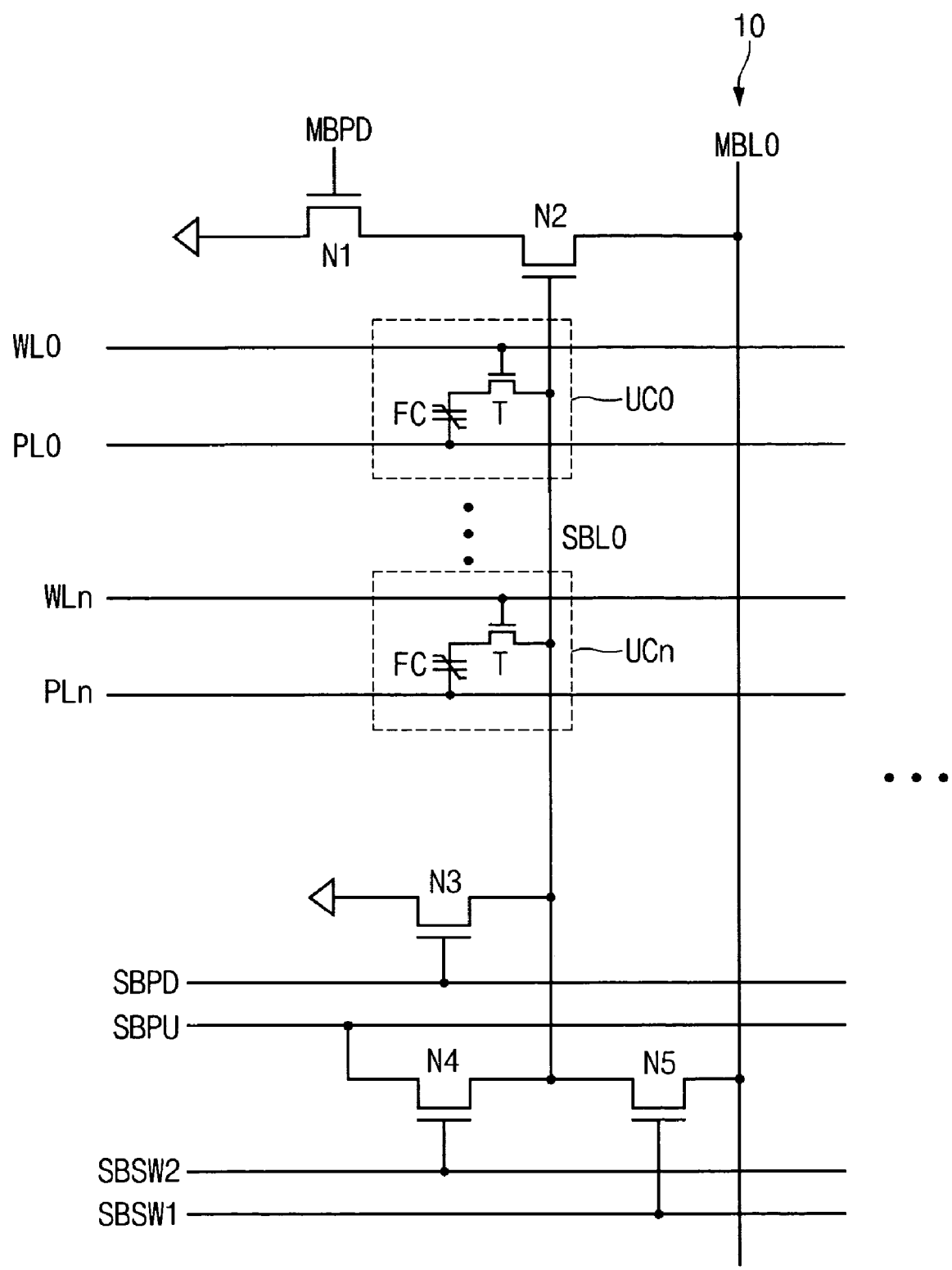
FIG. 2 is a circuit diagram illustrating a sub cell array 10 of FIG. 1.

FIG. 2 is a circuit diagram illustrating the sub cell array 10 of FIG. 1.

The sub-cell array 10 comprises a main bit line MBL0, a sub bit line SBL0, a plurality of switches N1~N5, and a plurality of unit cells UC0~UCn.

The switches N1~N5 are NMOS transistors. The switch N1 pulls down a main bit line MBL0 in response to a main bit line pull-down signal MBPD. The switch N2 regulates a level of a main bit line depending on a data level on the sub bit line SBL0. The switch N3 pulls down the sub bit line SBL0 in response to a sub bit line pull-down signal SBPD. The switch N4 selectively applies a sub bit line pull-up voltage SBPU to the sub bit line SBL0 in response to a second sub bit line selecting signal SBSW2. The switch N5 selectively connects a main bit line MBL0c to the sub bit line SBL0 in response to a first sub bit line selecting signal SBSW1 at a write mode.

Each of the unit cells UC0~UCn comprises one cell transistor T and one ferroelectric capacitor FC. Depending on a voltage applied to the word lines WL0~Wln, the cell transistor transmits a data level stored in the ferroelectric capacitor FC to the sub bit line SBL0 at a read mode or a data level on the sub bit line SBL0 to the ferroelectric capacitor FC at a write mode.

In the above-described sub cell array 10, each of the sub cell arrays 10 comprises the sub bit lines SBL0, and the main bit line MBL0 is shared by the sub cell arrays 10 and selectively connected to the sub bit lines SBL0.

Since the sub bit line SBL0 is separated from the main bit line MBL0, the capacitance of the sub bit line SBL0 remains independent of that of the main bit line MBL0 to reduce the whole capacitance of a bit line where sensing charges are transmitted. A sensing voltage of the sub bit line SBL0 of each sub cell array 10 is selectively transmitted to the main bit line MBL0 after it is amplified while separated from the main bit line MBL0.

Although the memory cell array 2 comprises a plurality of sub cell arrays 10 in the embodiment of the present invention, a main cell array (not shown) is comprised instead of a plurality of sub cell arrays 10 to embody a nonvolatile ferroelectric memory device including a fail cell detecting princess.

Figure 3:
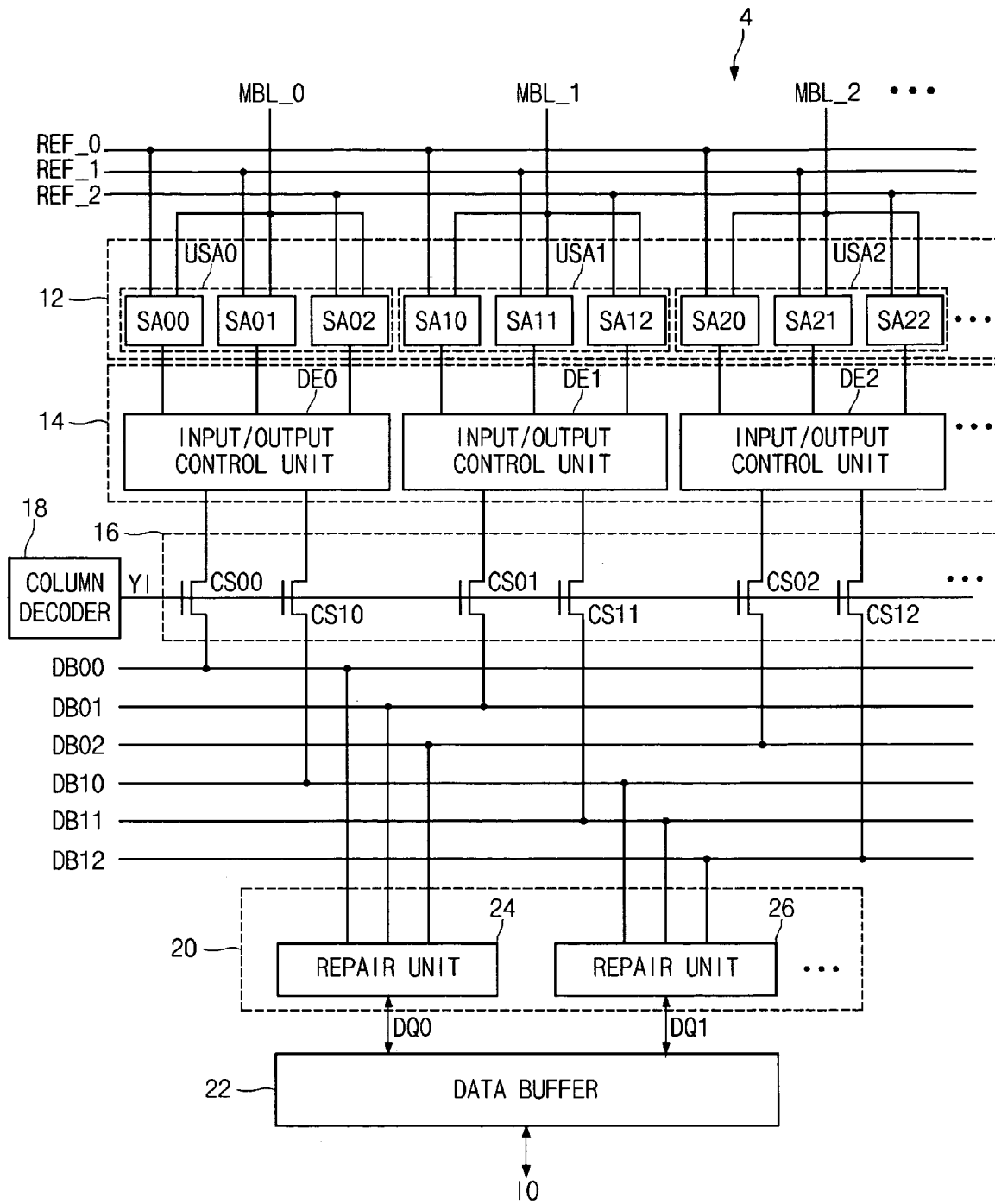
FIG. 3 is a circuit diagram illustrating a fail cell repairing block 4 of FIG. 1.

FIG. 3 is a circuit diagram illustrating a failed cell repairing block 4 of FIG. 1.

The failed cell repair block 4 comprises a sense amplifier 12, an input/output control unit array 14, a column switch array 16, a column decoder 18, a repair unit array 20 and a data buffer 22.

The sense amplifier array 12 includes unit sense amplifier arrays USA0~USAn corresponding one by one to main bit lines BL0~BLn. Each of the unit sense amplifier arrays USA0~USAn includes three sense amplifiers SA00, SA01, SA02~SAn0, SAn1, SAn2. Three unit sense amplifier arrays USA0, USA1, USA2 form one group to constitute one multi-bit data.

The input/output control unit array 14 comprises a plurality of input/output control units DE0~DEn corresponding one by one to the unit sense amplifier arrays USA0~-USAn.

Each of input/output control units DE0~DEn comprises an encoder (not shown) configured to encode a detection signal outputted from the sense amplifier array 12 corresponding to a data level signal at a read mode and convert the signal into 2 bit data to transmit the data to the column switch array 16 and a DAC (Digital to Analog Converter) (not shown) configured to convert the 2 bit data into a data level signal at a write mode and transmit the signal to the sense amplifier array 12.

The column switch array 16 comprises a plurality of column switches CS00~CS12 configured to selectively transmit the 2 bit data between the input/output control unit array 14 and the repair unit array 20 in response to a column selecting signal YI of the column decoder 18.

The repair unit array 20 comprises repair units 24 and 26 each configured to compare the 2 bit data received through the column switch array 16 to detect a failed cell, and to repair a failed data bit of the detected failed cell into an effective data bit. Each of the repair units 24 and 26 corresponds to the 2 bit data. Here, the number of the repair units 24 and 26 corresponds to that of multi-bit data.

The repair units 24 and 26 output multi-bit data applied from the data buffer 22 to the input/output control unit array 14 through the column switch array 16 at the write mode, and divide and compare the 2 bit data transmitted through the column switch array 16 into three pairs to detect a failed cell at the read mode. That is, the repair unit 24 and 26 transmit the same data bit when the 2 bit data are identical, but does not transmit the data bit when the 2 bit data are different.

The data buffer 22 buffers the effective data received from the repair unit array 20 or buffers externally inputted multi-bit data.

Figure 4:
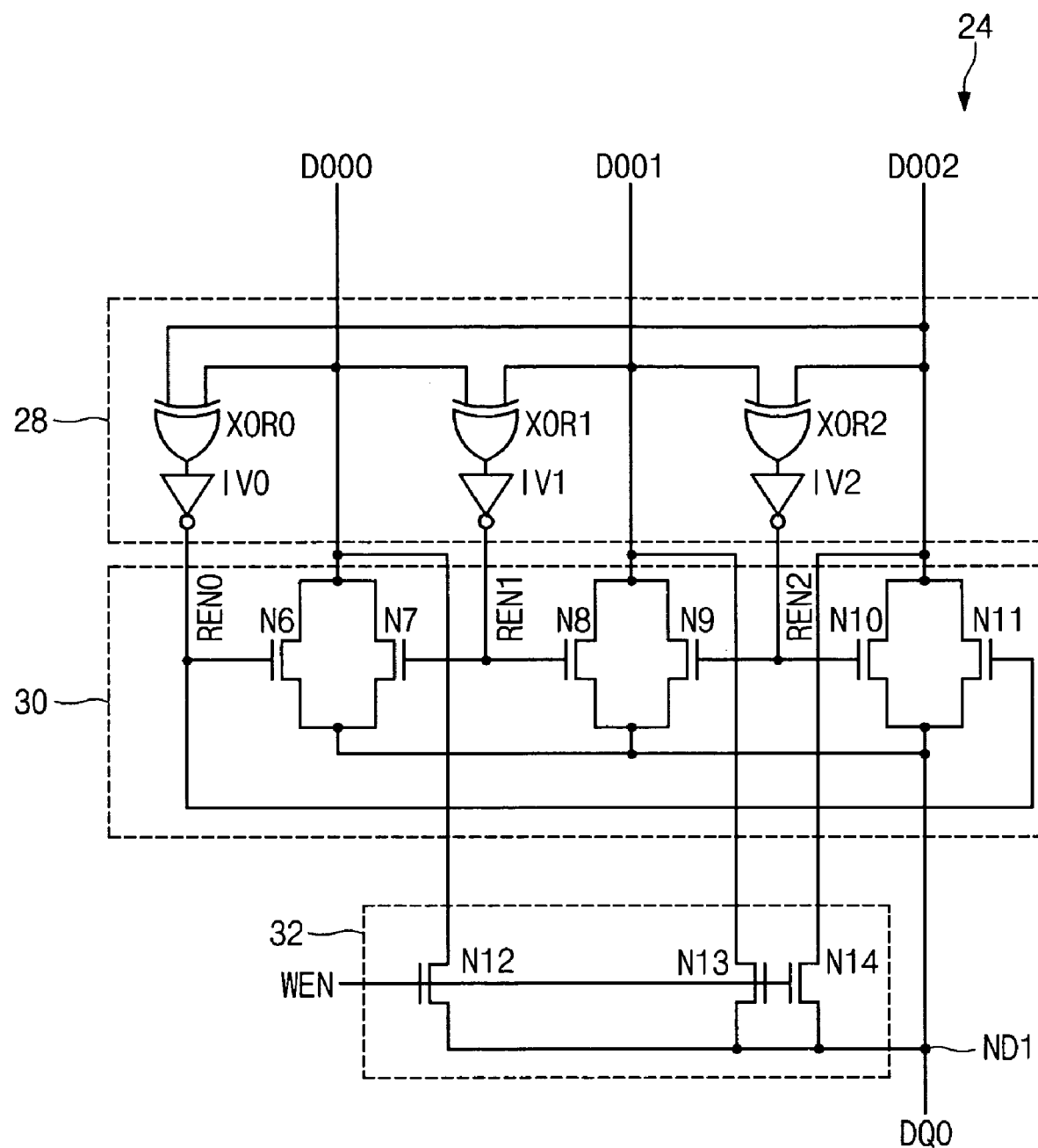
FIG. 4 is a circuit diagram illustrating a repairing unit 24 of FIG. 3.

FIG. 4 is a circuit diagram illustrating the repairing unit 24 of FIG. 3.

The repair unit 24 comprises a comparison unit 28, a data output switching unit 30 and a data input switching unit 32.

The comparison unit 28 comprises exclusive OR gates XOR0~XOR2 and inverters IV0~IV2.

The exclusive OR gate XOR0 identifies whether data bits on data buses DB00 and DB02 are identical. The inverter IV0 inverts an output signal from the exclusive OR gate XOR0 to output a comparison output signal REN0.

The exclusive OR gate XOR1 identifies whether data bits on data buses DB00 and DB01 are identical. The inverter IV1 inverts an output signal from the exclusive OR gate XOR1 to output a comparison output signal REN1.

The exclusive OR gate XOR2 identifies whether data bits on the data buses DB01 and DB02 are identical. The inverter IV2 inverts an output signal from the exclusive OR gate XOR2 to output a comparison output signal REN2.

The data output switching unit 30 comprises NMOS transistors N6~N11.

The NMOS transistors N6 and N11 have a control terminal to receive the comparison output signal REN0 and selectively transmit the data bits on the data buses DB00 and DB02. The NMOS transistors N7 and N8 have a control terminal to receive the comparison output signal REN1 and selectively transmit the data bits on the data buses DB00 and DB01. The NMOS transistors N9 and N10 have a control terminal to receive the comparison output signal REN2 and selectively transmit the data bits on the data buses DB01 and DB02.

The data input switching unit 32 comprises NMOS transistors N12~N14.

The NMOS transistors N12~N14 have a control terminal to receive a write enable signal WEN and selectively transmit inputted data DQ0 to the data buses DB00~DB02.

Figure 5:
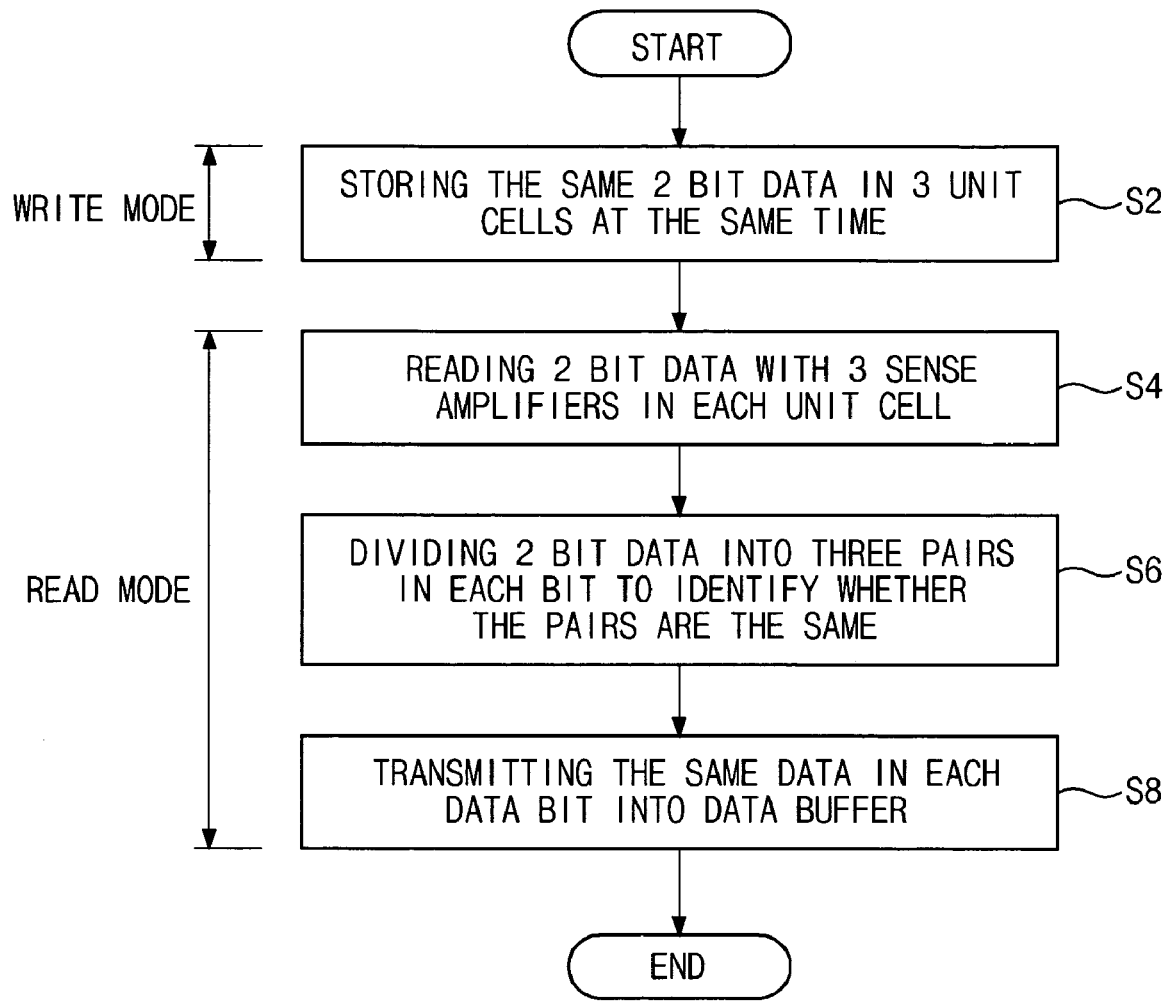
FIG. 5 is a flow chart illustrating a repair method of a multi-bit nonvolatile ferroelectric memory according to an embodiment of the present invention.

FIG. 5 is a flow chart illustrating a repair method of a multi-bit nonvolatile ferroelectric memory according to an embodiment of the present invention.

At the write mode, the multi-bit nonvolatile ferroelectric memory device according to the embodiment of the present invention stores a data level signal corresponding to the same 2 bit data in three unit cells at the same time.

That is, at the write mode, the write enable signal WEN is activated so that the NMOS transistors N12~N14 of the data input switching unit 32 are turned on.

The 2 bit data inputted through the data buffer 22 are transmitted into the input/output control units DE0~DE2 through the data buses DB00~DB12 and the column switches CS00~CS12.

The input/output control units DE0~DE2 convert the 2 bit data into data level signals to simultaneously store the same data level signals in three individual unit cells through the sense amplifiers SA00~SA12 and the main bit lines MBL0~MBL2 (S2).

Thereafter, the data level signals stored in the three unit cells are detected with the three sense amplifiers SA00~SA12, respectively (S4).

The input/output control units DE0~DE2 generate the 2 bit data corresponding to detection results of the sense amplifiers SA00~SA12. The converted 2 bit data are transmitted into the data buses DB00~DB12 through the column switches CS00~CS12.

The repair units 24 and 26 divide the 2 bit data on the data buses DB00~DB12 into three pairs in each bit to identify whether the pairs are the same (S6).

The repair units 24 and 26 identify the same data bit as an effective data bit to transmit the same data bit into the data buffer 22.

More specifically, the exclusive OR gate XOR0 of the comparison unit 28 of FIG. 4 performs an exclusive OR operation on the data bits on the data buses DB00 and DB02 to identify whether the two data bits are identical. As a result, the exclusive OR gate XOR0 outputs a low level signal "0" when the data bits on the data buses DB00 and DB02 are identical, and a high level signal "1" when the data bits are different.

The inverter IV0 inverts an output signal from the exclusive OR gate XoR0 to output the comparison output signal REN0. Then, the inverter IV0 outputs the comparison output signal REN0 as a high level signal "1" when the data bits on the data buses DB00 and DB02 are identical, and as a low level signal "0" when the data bits are different.

Thereafter, when the comparison output signal REN is a high level signal, the NMOS transistors N6 and N11 of the data output switching unit 30 are turned on, so that the data bits on the data buses DB00 and DB02 are applied to a node ND1 and outputted as the output data bit DQ0.

The exclusive OR gate XOR1 performs an exclusive OR operation on the data bits on the data buses DB00 and DB01 to identify whether the two data bits are identical. As a result, the exclusive OR gate XOR1 outputs a low level signal "0" when the data bits on the data buses DB00 and DB01 are identical, and a high level signal "1" when the data bits are different.

The inverter IV1 inverts an output signal from the exclusive OR gate XOR1 to output the comparison output signal REN1. As a result, the inverter IV1 outputs the comparison output signal REN1 as a high level signal "1" when the data bits on the data buses DB00 and DB01 are identical, and as a low level signal "0" when the data bits are different.

Thereafter, when the comparison output signal REN1 is a high level signal, the NMOS transistors N7 and N8 of the data output switching unit 30 are turned on. As a result, the data bits on the data buses DB00 and DB01 are applied to the node ND1 and outputted as the output data bit DQ0.

The exclusive OR gate XOR2 performs an exclusive OR operation on the data bits on the data buses DB01 and DB02 to identify whether the two data bits are identical. As a result, the exclusive OR gate XOR2 outputs a low level signal "0" when the data on the data buses DB01 and DB02 are identical, and a high level signal "1" when the data are different.

The inverter IV2 inverts an output signal from the exclusive OR gate XOR2 to output the comparison output signal REN2. As a result, the inverter IV2 outputs the comparison output signal REN2 as a high level signal "1" when the data bits on the data buses DB01 and DB02 are identical, and as a low level signal "0" when the data bits are different.

Thereafter, when the comparison output signal REN2 is a high level signal, the NMOS transistors N9 and N10 of the data output switching unit 30 are turned on, so that the data bits on the data buses DB01 and DB02 are applied to the node ND1 and outputted as the output data bit DQ0 (S6).

The repair units 24 and 26 compare the data bits on the data buses DB00~DB12 to output the same data bit to the data buffer 22 (Step S8).

TABLE 1

| Write mode | | | Read mode | | | |
|---|---|---|---|---|---|---|
| Data bit stored in cell | | | Data bit on data bus | | | DQ0 or DQ1 |
| 0 | 0 | 0 | 0 | 0 | 0 | 0 |
| 0 | 0 | 0 | 0 | 0 | 1 | 0 |
| 0 | 0 | 0 | 0 | 1 | 0 | 0 |
| 0 | 0 | 0 | 1 | 0 | 0 | 0 |
| 1 | 1 | 1 | 0 | 1 | 1 | 1 |
| 1 | 1 | 1 | 1 | 0 | 1 | 1 |
| 1 | 1 | 1 | 1 | 1 | 0 | 1 |
| 1 | 1 | 1 | 1 | 1 | 1 | 1 |

As shown in Table 1, even when one of the data bits on the data buses DB00~DB12 has failed, the output data bits DQ0 and DQ1 generated depending on the comparison result of the repair units 24 and 26 are identical with data stored in a unit cell. As a result, when approximately 33% failed cells are generated, the whole cell data can be effectively corrected.

Figure 6:
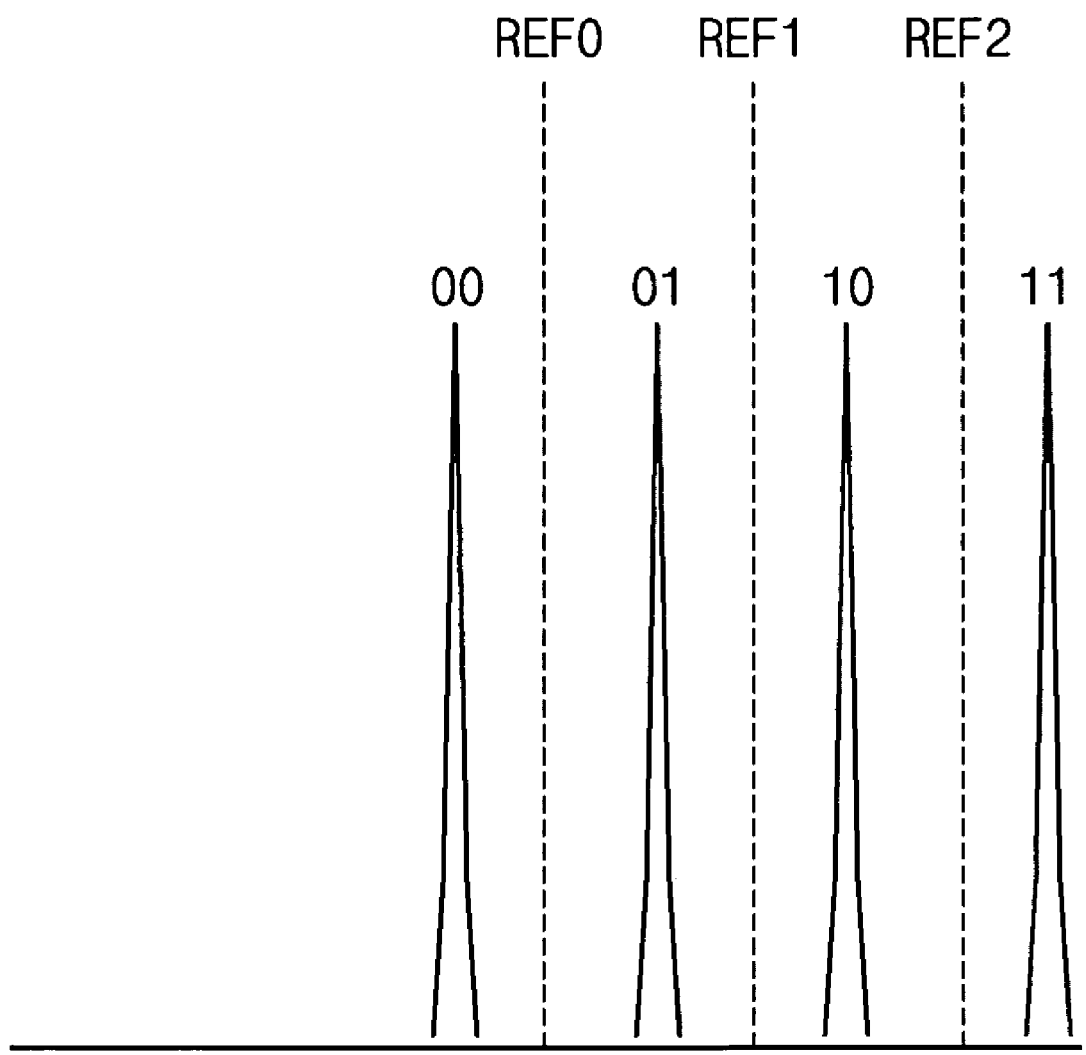
FIG. 6 is a diagram illustrating data distribution of the multi-bit nonvolatile ferroelectric memory cell of FIG. 1.

In the above-described nonvolatile ferroelectric memory device, as shown in FIG. 6, failed cells are screened, so that 2 bit 4 level data level distribution shows a very small cell data level distribution characteristic, that is, the characteristic of normal cells.

When failed cell data are subjected to screen treatment in each bit, 2 effective data can be obtained. That is, 2 data are obtained from three unit cells, so that one data can be obtained in a 1.5 cell. As a result, a cell array area which is larger than 1T1C but smaller than 2T2C can be embodied.

Figure 7:
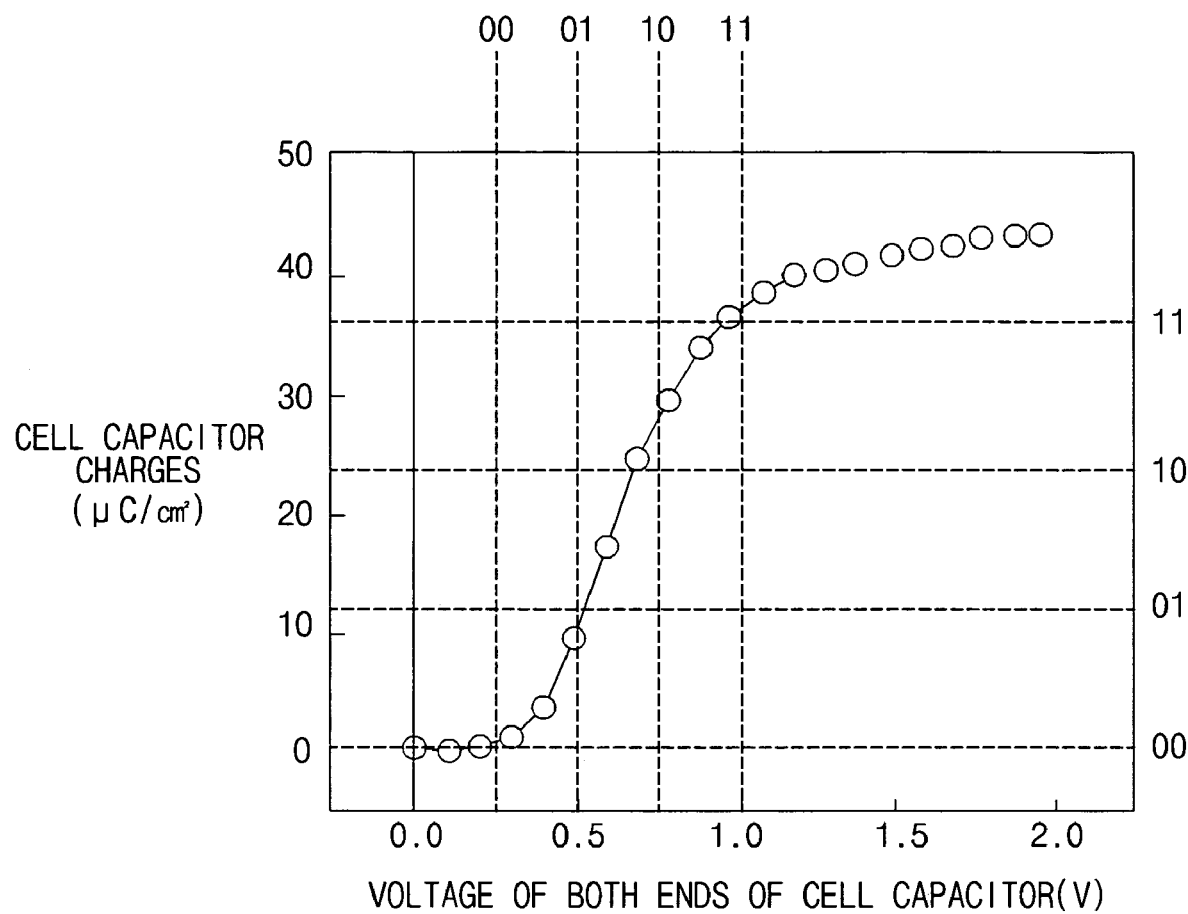
FIG. 7 is a diagram illustrating a data storage state of a multi-bit nonvolatile ferroelectric memory cell of FIG. 2.

FIG. 7 is a diagram illustrating a data storage state of a multi-bit nonvolatile ferroelectric memory cell of FIG. 2.

Cell capacitor charges stored in 2 bit data are differentiated depending on a voltage of both ends of the cell capacitor FC. That is, the charges stored in the cell capacitor FC are distinguished depending on the voltage of both ends of the cell capacitor, and stored as "00", "01", "10" and "11".

As described above, a multi-bit nonvolatile ferroelectric memory device compares cell data stored in unit cells to effectively process randomly distributed cell data, thereby improving yield of the memory device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A multi-bit nonvolatile ferroelectric memory device comprising:
   a plurality of memory cell arrays each including a plurality of multi-bit unit cells connected serially; and
   a correcting block adapted and configured to group a predetermined number of multi-bit unit cells in one memory group to store a data level signal corresponding to multi-bit data in each memory group at a write mode, and to convert the data level signal of a selected memory group at a read mode into the multi-bit data and compare the stored multi-bit data in each bit to identify an identical data bit as an effective data bit.

2. The multi-bit nonvolatile ferroelectric memory device according to claim 1, wherein the memory cell array has a hierarchical bit line structure including a plurality of sub bit lines connected to one main bit line.

3. The multi-bit nonvolatile ferroelectric memory device according to claim 1, wherein the multi-bit unit cell comprises:
   a switch unit adapted and configured to have a control terminal connected to a word line and selectively transmit a data level signal to a bit line; and
   a ferroelectric capacitor adapted and configured to have one terminal connected to a plate line and a second terminal connected to the switch unit.

4. The multi-bit nonvolatile ferroelectric memory device according to claim 1, wherein the correcting block comprises:
   a plurality of sense amplifiers each adapted and configured to detect a data level signal stored in the predetermined number of multi-bit unit cells depending on a reference voltage;
   a plurality of input/output control units each adapted and configured to generate multi bit data corresponding to detection signals outputted from the plurality of sense amplifiers at a read mode, and to generate the data level signal corresponding to multi-bit data inputted externally at a write mode; and
   a plurality of correcting units each adapted and configured to identify the multi-bit data of each memory group which are converted by the input/output control unit at a read mode in each bit to identify an identical data bit as an effective data bit and output the identified identical data bit externally, and to transmit externally inputted data bits.

5. The multi-bit nonvolatile ferroelectric memory device according to claim 4, wherein the plurality of sense amplifiers are divided into sense amplifier groups corresponding to the predetermined number of multi-bit unit cells included in the memory group, and each of the sense amplifier groups includes the sense amplifiers corresponding to a number of bits of the multi-bit data.

6. The multi-bit nonvolatile ferroelectric memory device according to claim 5, wherein the plurality of input/output control units correspond one by one to the sense amplifier groups.

7. The multi-bit nonvolatile ferroelectric memory device according to claim 4, wherein the correcting block includes correcting units corresponding to the number of bits of the multi-bit data.

8. The multi-bit nonvolatile ferroelectric memory device according to claim 4, wherein the correcting block further comprises a plurality of column switches each adapted and configured to selectively transmit the multi-bit data between the input/output control unit and the comparison unit in response to a column selecting signal.

9. The multi-bit nonvolatile ferroelectric memory device according to claim 8, wherein the correcting block further comprises a column decoder adapted and configured to generate the column selecting signal depending on a column address.

10. The multi-bit nonvolatile ferroelectric memory device according to claim 4, wherein each of the plurality of correcting units comprises:
    a comparison unit adapted and configured to identify whether multi-bit data corresponding to the memory groups are the same; and
    a plurality of data output switch units each adapted and configured to selectively transmit the identical multi bit data in response to an output signal from the comparison unit.

11. The multi-bit nonvolatile ferroelectric memory device according to claim 10, wherein each of the plurality of correcting units further comprises a plurality of data input switch units each adapted and configured to selectively transmit externally inputted multi-bit data in response to a write enable signal.

12. The multi-bit nonvolatile ferroelectric memory device according to claim 10, wherein each of the plurality of comparison units comprises an exclusive OR gate.

13. The multi-bit nonvolatile ferroelectric memory device according to claim 10, wherein the data output switch unit comprises a plurality of transistors each adapted and configured to have a control terminal to receive an output signal from the plurality of comparison units and selectively transmit multi-bit data generated from the input/output control unit.

14. A method for repairing a fail cell of a multi-bit nonvolatile ferroelectric memory device, the method comprising:
    the write step of storing a data level signal corresponding to the identical multi-bit data inputted to a memory group including the predetermined number of multi-bit unit cells; and
    the read step of converting data level signals stored in the memory group into multi-bit data and comparing the multi-bit data in each bit to identify the identical data bit as an effective data bit.

15. The method according to claim 14, wherein the read step comprises:
    converting data level signals into multi-bit data corresponding to the data level signals stored in the selected memory group at the write step;
    comparing the multi-bit data in each bit; and
    identifying the identical data bit as an effective data bit depending on the comparison result.

* * * * *